United States Patent

Cassat et al.

[11] Patent Number: 5,904,954
[45] Date of Patent: May 18, 1999

[54] COMPOSITE ARTICLE AND METHOD FOR MAKING SAME

[75] Inventors: Robert Cassat, Ternay; Jean-Paul Faure, Saint-Fons, both of France

[73] Assignee: Kermel SNC.,, Colmar, France

[21] Appl. No.: 08/722,093

[22] PCT Filed: Apr. 18, 1995

[86] PCT No.: PCT/FR95/00505

§ 371 Date: Oct. 17, 1996

§ 102(e) Date: Oct. 17, 1996

[87] PCT Pub. No.: WO95/28278

PCT Pub. Date: Oct. 26, 1995

[30] Foreign Application Priority Data

Apr. 19, 1994 [FR] France .................................. 94 04910

[51] Int. Cl.⁶ ...................................................... B05D 1/14
[52] U.S. Cl. ...................... 427/206; 427/200; 427/389.9; 427/394; 428/90; 428/96
[58] Field of Search .................. 428/86, 90, 96; 427/200, 206, 389.9, 394

[56] References Cited

U.S. PATENT DOCUMENTS

| | | | |
|---|---|---|---|
| 3,328,218 | 6/1967 | Noyes | 428/86 |
| 3,900,651 | 8/1975 | Hoppe et al. | 428/86 |
| 4,034,134 | 7/1977 | Bregorian et al. | 428/86 |
| 4,260,445 | 4/1981 | Mayumi et al. | 428/86 |
| 4,590,115 | 5/1986 | Cassat | 428/174 |
| 4,610,905 | 9/1986 | von Blücher et al. | 428/90 |
| 4,828,897 | 5/1989 | Staneluis et al. | 428/86 |
| 4,925,719 | 5/1990 | Staneluis et al. | 428/86 |
| 4,927,682 | 5/1990 | Nagura et al. | 428/90 |

FOREIGN PATENT DOCUMENTS

| | | | |
|---|---|---|---|
| 162 645 | 11/1985 | European Pat. Off. | C04B 41/50 |
| 2 719 502 | 11/1978 | Germany | D06N 7/04 |
| WO 89 00088 | 1/1989 | WIPO | B05D 1/36 |

*Primary Examiner*—Terrel Morris
*Attorney, Agent, or Firm*—Andrew M. Solomon

[57] ABSTRACT

A composite material and a method for making same are disclosed. A composite article including an electrically and/or thermally insulating substrate and protective layers on each side thereof is particularly disclosed. Said material includes protective layers consisting of fibers of a heat-stable material flocked onto the insulating substrate, and heat-stable coating resin. The resulting protective layer has improved protective properties, particularly moisture-proofness. The composite material may also be used as a metal layer carrier for forming flexible printed electrical circuits.

6 Claims, No Drawings

COMPOSITE ARTICLE AND METHOD FOR MAKING SAME

The present invention relates to a composite article and to a process for its manufacture.

It relates more particularly to a composite article including an electrically and/or thermally insulating substrate and protective layers for this substrate which are placed on each face thereof.

In the field of electrical technology electrical motors are generally insulated using flexible materials such as films made of plastic, like polyester films. However, these films can be sensitive to the environment, especially to moisture, or can have insufficient mechanical and heat-resistance properties. To overcome these disadvantages it has been proposed to form a composite material including an electrically insulating film sandwiched between two protective layers made of heat-resistant paper. This composite material requires, on the one hand, the manufacture of papers consisting, for example, of chopped aramid fibres and of fibrids, also of aramid, and, on the other hand, an application of the paper onto the electrically insulating support in a continuous manner in order to have good adhesiveness between the layers. This process for the manufacture of the composite material is relatively complex. In addition, the leaktightness of the protective paper layers, especially in relation to moisture, is not perfect.

Furthermore, electrically insulating substrates, especially electrically insulating flexible films, are also employed for the manufacture of flexible electrical printed circuits. These articles are obtained by metallizing one face, preferably both faces, of the film and then by producing electrical circuits by, for example, processes of chemical etching of the metallized layer. Electronic components such as transistors, diodes or capacitors are soldered onto these circuits, for example by tinning.

The support films must have good dimensional stability, especially at the soldering temperature. For this reason polyester films are increasingly replaced by films made of plastic which have improved heat resistance and dimensional stability, such as polyimide or polyaramid resins. However, the cost of manufacture of these plastics is much higher.

One of the objectives of the present invention is to overcome these disadvantages by proposing a thermally and electrically insulating composite material including protective layers which are leakproof, especially to moisture, and which can be obtained by a simple application process. This material can be employed as an electrically insulating substrate for the production of flexible electrical printed circuits after deposition of a metal layer on at least one of the faces of the composite material by the processes for application of a film of copper or for metallizing.

To this end the invention proposes a composite article including a continuous support layer and protective layers placed on at least one face of the support or substrate layer.

According to the invention at least one of the protective layers is formed by a heat-resistant resin including reinforcing fibres made of heat-resistant material which are flocked onto the surface of the support or substrate.

According to a preferred embodiment of the invention the support or substrate layer is an electrically and/or thermally insulating continuous layer.

Films made of electrically and/or thermally insulating synthetic material such as polyester, polyolefins, polycarbonates, polyphenylene sulphide, polyimides, thermotropic polyesters and the like, may be mentioned, by way of example, as support or substrate layer which is suitable for the invention.

Fibres made of heat-resistant material which are suitable for the invention are, for example, fibres made of polyimide, polyaramid and polyamide-imide.

Polyimide, polyamide-imide, polyaramid, bismaleimide, epoxy and triazine resins or a mixture thereof may be mentioned by way of example of heat-resistant resin which is suitable for the invention.

More advantageously, resins which are suitable for the invention are resins which can be deposited onto the layer of flocked fibres in the form of solution, the resin being precipitated either by exchange of the solvent with a third solvent, according to a coagulation process, or by precipitation, for example, in gel form, or by evaporation of the solvent.

Preferred resins which may be mentioned in particular are polyamide-imides, and especially those obtained by reaction of a diisocyanate such as toluene diisocyanate, 4,4'-diphenylmethane diisocyanate, diphenyl ether 4,4,'-diisocyanate, meta-phenylene diisocyanate, 1,6-hexamethylene diisocyanate, biscyclohexyl diisocyanate or the like with an acid anhydride such as trimellitic anhydride or a dianhydride in the presence or absence of aromatic diacids such as isophthalic acid or terephthalic acid, and 1,3-dicarboxybenzenesulphonate.

According to another characteristic of the invention the flocked fibres are placed on the support or substrate layer according to the conventional flocking techniques, that is to say by coating the surface to be flocked with an adhesive an depositing a layer of fibres which are kept substantially parallel to each other and perpendicular to the surface to be flocked by, for example, an electrical field.

Suitable adhesives for the invention which may be mentioned are heat-resistant adhesives, for example the two-component adhesives of polyester/polyurethane type which are marketed by the company Henkel.

In one embodiment of the invention the fibres may be of different or identical lengths. The length of the fibres and the density of the flocked layer are thus determined as a function of the properties and of the use of the composite structure, for example as a function of the desired thickness and surface appearance of the protective layers.

The protective layer thus formed is continuous and exhibits good mechanical properties, especially due to the presence of the flocked fibres which, under the effect of the coagulation or precipitation of the coating resin, can be flattened down towards the support layer and can form a reinforced protective layer.

In another embodiment of the invention the composite material thus formed may be subjected to a finishing treatment which consists, in particular, in applying pressure to the surface of the protective layer in order to configure the latter as a function of the desired utilizations. This treatment may also be a form of calendering which will make it possible to obtain uniformity of the surface of the protective layer(s) and of the thickness of the composite material.

The material of the invention exhibits good cohesion, due especially to the bonding of the coating resin to the face of the support layer, this bond being improved and reinforced by the presence of the flocked fibres.

In addition, the cohesion of the protective layers makes it possible to improve the aging resistance of the composite material by limiting the exposure of the support layer, such as the polyester film, to the surrounding atmosphere, such as moisture, radiation and the like. The insulating properties of the support layer are thus maintained at an acceptable level for a longer period.

Furthermore, the use of a coating resin allows numerous additives to be added to the flocked protective surface(s), such as water-repelling compounds, lubricants, colorants or the like. These additives make it possible to improve the properties and the configuration of the composite material for the desired utilization.

Thus, in the case where the composite material of the invention is intended to be employed as support for a metallic layer, especially for the manufacture of flexible electrical printed circuits, the coating resin may include a filler such as a metal oxide like, for example, cuprous oxide, allowing the surface of the protective layer to be metallized.

One of the subjects of the present invention is especially a composite material of structure as described above and including a metal layer at least on one of its faces. This metal layer may be deposited by any known techniques for depositing metal on the faces of a plastic film. An example which may be mentioned—no limitation being implied—is the technique of applying a sheet of metal, for example of copper, by adhesive bonding to the face of the composite material or, preferably, the formation of a metallic layer by electrolytic and/or electrochemical metallizing processes. In fact, owing to the possibility of introducing a metallizing precursor additive into the coating resin, the composite structure of the invention permits an easy application of a metallizing process, like that described in French Patent No. 2518126.

Briefly, the metallization process described in this French Patent consists in introducing into the substrate to be metallized a filler capable of giving rise at the surface to metallic priming sites for the metallization. Suitable fillers are especially nonconductive metal oxides such as copper oxide. The surface of the substrate is then subjected to the action of a reducing agent, such as a borohydride, capable of reducing the abovementioned metal oxide to conductive metal. The reduced metal forms metallic priming sites which are compatible with direct metallizing by an electrolytic and/or electrochemical route.

The metallized composite material of the invention is ideally suitable for the production of a flexible electrical printed circuit because the whole unit has good dimensional stability even at soldering temperatures, whatever the nature of the support film. In fact, as the protective layers are produced using heat-resistant materials, the shrinkage of the support film is prevented. This advantage makes it possible to employ a support film which does not necessarily have good dimensional stability in relation to temperature, like polyester films.

Furthermore, the structure of the invention exhibits better aging resistance allowing the printed circuits to be employed for a long time or in a hostile environment. Finally, the electrical insulation between the two faces of the substrate is improved.

Another subject of the invention is a process for the manufacture of a composite material as described above, which consists:

in depositing a layer of flocked fibres on at least one face of an electrically and/or thermally insulating support layer, consisting of heat-resistant fibres, and in coating the flock with a heat-resistant resin to form a protective layer for the insulating support layer.

According to a characteristic of the invention the coating of the flocked layer is carried out with a solution of resin, the resin being precipitated onto and/or into the layer of flocked fibres in order thus to obtain a layer of fibre-reinforced resin.

Precipitation of the resin is to be understood especially as the technique which makes it possible to deposit a solution of resin onto the flocked layer and to bring this layer into contact with a liquid which is a nonsolvent for the resin, for example by immersing the structure in the nonsolvent liquid; this technique is known by the name of coagulation.

However, other techniques causing the precipitation or gelling of the resin may be employed without departing thereby from the scope of the invention.

The composite structure is next subjected to drying to remove the solvent or the nonsolvent.

The coating of the flocked fibres by coagulation of a resin makes it possible, during the coagulation, to replace the solvent of the resin, which generally has a high boiling point, with another compound which is a nonsolvent for the resin, such as water, which has an appreciably lower boiling point. The drying of the composite structure can thus be carried out at a lower temperature, reducing the risks of damage to the support film.

According to an embodiment of the invention the coating solution has a resin weight content of between 5% and 50%.

Suitable solvents for the invention are, for example, N-methylpyrrolidone, dialkylureas such as dimethylethyleneurea (DMEU) or dimethylpropyleneurea, dimethylacetamide, dimethylformamide, ketones, dimethyl sulphoxide or a mixture of these with other inert solvents such as xylene, dimethyl ether or di- or triethylene glycol.

The coagulation of the resin is generally carried out by bringing the flocked layer coated with the resin solution into contact with water.

The resin solution may contain additives which make it possible to improve its ability to wet the flocked fibres. However, to improve the wetting of the fibres in the resin, they may be treated with a finishing agent which modifies the surface tension.

After drying, the composite structures of the invention exhibit good cohesion.

Other advantages and details of the invention will appear more clearly in the light of the examples which are given below solely by way of illustration.

EXAMPLES

Preparation of a composite material with uncoated flocked layers

A two-component adhesive of polyester/polyurethane type, marketed by the company Henkel, is deposited with a gravure roll onto a 2GT polyester film of 125 μm thickness at a rate of 50 g/m².

This adhesive-coated polyester film travels, resting on an apron, under a feed hopper for polyamide-imide flock fibres marketed under trademark Kermel (count 2.2 dtex—length 0.3 mm).

Between the feed hopper and the film a device enables an electrical field to be established in which the fibres delivered by the hopper are accelerated and oriented, and this causes them to be planted in the adhesive (the electrical field is established between a grid at the hopper outlet and the film-support apron).

At the exit from the deposition of the flocked fibres, beater rolls followed by a suction exhaust remove the fibres which have not been secured by the adhesive.

Thus flocked, the film undergoes a heat treatment to perform the drying and the crosslinking of the adhesive.

In the case of two-face flocking the same treatment is then performed on the other face.

The material thus obtained, completely symmetrical, has a weight per unit area of 330 g/m² (including 175 g of polyester film and 155 g of adhesive+flocked fibres).

Coating of the flocked layers

A polyamide-imide resulting from the polycondensation of trimellitic anhydride and of 2,4-toluene diisocyanate is prepared in dimethylethyleneurea (solids content: 27%-viscosity 280 poises at 25° C.), according to the process described in European Patent No. 0360707.

Two solutions of the above resin in dimethylethyleneurea are prepared:

Solution A1: viscosity 85 poises at 30° C.

Solution A2: viscosity 3.2 poises at 30° C.

The flocked layers of the composite material obtained above are coated with the solutions A1 and A2.

The coating is carried out by immersing the flocked film in a trough containing the solution and then wringing the coated material between 2 rollers pressed against one another by adjustable springs.

On leaving the wringing the coated material is immersed in water, causing the coagulation of the solution of polyamide-imide, and is then washed under a light stream of water to extract the residue of solvent retained by the resin.

At this stage the material treated by coating-coagulation has a dry and solid feel but actually contains traces of solvent and a certain percentage of water. These components (solvent and water) ensure some plasticization of the polyamide-imide.

In this plasticized state densification of the product can be carried out by pressing or calendering.

It is also possible to obtain this densification merely by drying the material at a temperature close to 100° C. to remove the trapped water. This water removal causes a shrinkage of the coating resin in the direction of thickness.

The characteristics of the composite materials thus obtained are given in Table I below:

TABLE 1

| Test No. | Solution | Pass pressure | Thickness μm |
| --- | --- | --- | --- |
| 1 | A2 | not pressed | 0.98 |
| 2 | A1 | not pressed | 1.06 |
| 3 | A2 | 70 bars | 0.56 |
| 4 | A1 | 70 bars | 0.78 |
| 5 | A2 | 250 bars | 0.43 |
| 6 | A1 | 250 bars | 0.55 |

The quantities of resin which are retained are 230 g/m² with solution A1

185 g/m² with solution A2.

A coating coagulation was carried out with the resin of the preceding test but after a dilution to obtain a solution which had a viscosity of 34 poises at 30° C. (solution C1).

Starting with a polyimide-amide resin resulting from the condensation of 100 moles of 2,4-toluene diisocyanate, 20 moles of trimellitic anhydride, 76 moles of terephthalic acid and 4 moles of sodium 1,3-dicarboxybenzenesulphonate, in DMEU, a solution is prepared by dilution in DMEU to obtain a viscosity of 25 poises at 30° C. (solution C2).

The 330 g/m² flocked film employed previously is treated by coating coagulation as already described with the above solutions C1 and C2.

The characteristics of the products obtained are collated in Table II below:

TABLE II

| Test No. | Solution | Pass pressure (bar) | Thickness μm | Weight per unit area g/m² |
| --- | --- | --- | --- | --- |
| 7 | C1 | 70 | 610 | 860 |
| 8 | C2 | 70 | 540–560 | 525 |
| 9 | C1 | 250 | 530 | 560 |
| 10 | C2 | 250 | 480–520 | 530 |
| 11 | C1 | 250 | 460 | 525 |
| 12 | C2 | 250 | 480 | 525 |

In these examples each impregnation was performed separately, resulting in the appearance of different resin contents as a function of the operating conditions.

The following examples illustrate an advantage of the invention, namely the possibility of incorporating additives into the impregnating solutions.

By way of example, the manufacture of a composite material will be described in which the surfaces of the protective layers are metallized in order thus to obtain a flexible electrical printed circuit.

$Cu_2O$ (cuprous oxide) marketed by the company Norddeutsche Affinerie is introduced into solutions C1 and C2 in a proportion of 30% by weight relative to the dry resin contained in the solutions.

These filled solutions are employed according to a process which is identical with that described in the preceding examples, to obtain composite structures whose characteristics are collated in Table III below:

TABLE III

| Test No. | Solution | $Cu_2O$/dry resin | Pressing | Thickness μm | Weight per unit area g/m² |
| --- | --- | --- | --- | --- | --- |
| 13 | C1 | 30% | 250 bars | 470 | 555 |
| 14 | C2 | 30% | 250 bars | 450 | 555 |

After coating coagulation the material is dark red.

To remove the film of pure resin at the surface and to reveal the $Cu_2O$ particles, the substrate is treated by wet sandblasting under Vapor Blast (trade name) equipment with an AVB 90 (trademark) abrasive and a blasting pressure of 4 bars at a distance of 15–20 cm. The substrate is then carefully rinsed and dried under a stream of warm air. The surface roughness shows the coefficients Ra>3 and Rt>28.

The surfaces of the flocked layers are next subjected to a metallization process.

The $Cu_2O$ reduction bath is an aqueous solution including:

0.7 g of Rhodopol® (heteropolysaccharide)

5 g of potassium hydroxide 20 g of Na Kc double tartrate 20 g of sodium iodide and 50 g of $NaBH_4$.

The material to be metallized is immersed in the bath and immediately withdrawn, at a speed of approximately 1 cm/s in order that the formation of the film of reactant at the surface of the substrate should be homogeneous. The substrate withdrawn from the reduction bath is left in the open air and then washed and rinsed with water.

The rinsed, undried substrate is immersed in a bath of chemical type EC 580 (trade reference) copper from the company Kemifar, at 40° C., for 15 min.

After rinsing, the copper-coated substrate is passivated to prevent oxidation, by immersion in a passivating solution at a concentration of 3% in water of KEM 1044 (trade name) from the company Kemifar.

Whatever the nature of the solution C1 or C2, the thickness of the chemical copper deposit is from 1.5 to 1.8 μm.

This metallized composite material can be treated by known processes to produce a flexible electrical printed circuit.

What is claimed is:

1. A process for the manufacture of a composite article comprising an electrically or thermally insulating substrate consisting of a flexible film and at least one protective layer placed on a face of said substrate, wherein at least one protective layer is formed by a heat-resistant resin comprising reinforcing fibres made of heat-resistant material which are flocked onto the surface of said substrate, comprising the following steps:

forming a layer of flocked heat-resistant fibres on one face of an electrically or thermally insulating substrate consisting of a flexible film;

coating the flocked layer with a solution in a solvent of a heat-resistant resin;

precipitating the resin in or on the flocked layer; and drying the article.

2. A process according to claim 1, wherein the resin solution has a resin weight content of between 5% and 50%.

3. A process according to claim 1, wherein the solvent of the resin solution is selected from the group consisting of N-methylpyrrolidone, dialkylureas such as dimethylethyleneurea or dimethylpropyleneurea, dimethylacetamide, dimethylformamide and ketones.

4. A process according to claim 1, wherein the precipitation of the resin is obtained by coagulation.

5. A process according to claim 4, wherein the coagulation of the resin is obtained by bringing the coated flocked layer into contact with a nonsolvent for the resin.

6. A process according to claim 1, further comprising the step of exerting a pressure on the flocked protective layer.

* * * * *